United States Patent [19]

Troccolo

[11] Patent Number: 5,795,684
[45] Date of Patent: Aug. 18, 1998

[54] PHOTOLITHOGRAPHY MASK AND METHOD OF FABRICATION

[75] Inventor: Patrick M. Troccolo, Palo Alto, Calif.

[73] Assignee: Intel Corporation, Santa Clara, Calif.

[21] Appl. No.: 628,184

[22] Filed: Apr. 5, 1996

[51] Int. Cl.$^6$ ........................................ G03F 9/00
[52] U.S. Cl. ............................... 430/5; 430/314
[58] Field of Search .................. 430/5, 311, 312, 430/313, 314

[56] References Cited

U.S. PATENT DOCUMENTS

| | | | |
|---|---|---|---|
| 5,437,947 | 8/1995 | Hur et al. | 430/5 |
| 5,480,747 | 1/1996 | Vasudev | 430/5 |

*Primary Examiner*—S. Rosasco
*Attorney, Agent, or Firm*—Naomi Obinata

[57] ABSTRACT

A novel mask for photolithography in semiconductor processing and fabrication method is disclosed. The mask includes a layer of transmissive material transparent to the wavelength of light to be used deposited thereon. The transmissive material is plasma etched in accordance with a pattern in photoresist deposited thereon to create trench portions in the transmissive material. A layer of absorbing material absorptive to the wavelength of light to be used is deposited within the trench portions. The surface of the mask is then planarized to create a substantially smooth mask layer having trench portions in the transmissive material and absorbing layer portions within the trench portions. If desired, a second layer of transmissive material can be deposited over the smooth mask layer to provide a protective cap to create an overall smooth, flat completed mask surface. The mask is useful for transmissive photolithography applications as well as reflective photolithography applications.

30 Claims, 6 Drawing Sheets

A Method of Fabricating a Mask

PHOTOLITHOGRAPHY MASK AND METHOD OF FABRICATION

BACKGROUND OF THE INVENTION

1. Field of the Invention

The present invention relates to the field of semiconductor processing, and more specifically relates to a novel mask structure for use in photolithography and fabrication process thereof 2. Discussion of Related Art Modern integrated circuits are made of millions of devices fabricated on a substrate. The substrate is usually a silicon device wafer. The devices are fabricated in a sequence of deposition of a thin film of semiconductor, insulator or conductive material and patterning the material in accordance with a preselected device layer pattern for the given material. The patterning step involves photolithography and etching.

Photolithography is commonly carried out in a tool known as a "stepper". The photolithography sequence typically is as follows: a silicon device wafer substrate having a layer of film to be patterned covered with a layer of photoresist is placed within a stepper onto a stage. A mask is placed above and over the device wafer. The mask contains the pattern that is to be replicated onto the device wafer. Usually the mask dimensions are larger than the dimensions to be printed onto the photoresist; a series of reducing lenses focus the pattern to be the size desired for printing on the photoresist. In the case of a transmissive mask the mask pattern is created by transmissive and absorbing material portions arranged in a pattern on the mask. When light of a selected wavelength, for example, 248 nanometers ("nm"), is applied to the mask the "transmissive" portions of the mask, which are transparent to the selected wavelength, allow the light to pass through the mask and the "absorbing" portions, which are opaque to and absorb the selected wavelength, block the light transmission. The pattern on the mask is thereby replicated onto the photoresist on the device wafer. If a reflective mask is used, the mask surface contains reflective portions and absorbing portions. When light of a selected wavelength is applied to the mask the light is reflected off the reflecting portions. The reflected image from the mask usually is further reflected off a mirror or mirror-coated lens or series of mirrors or mirror-coated lenses and then onto the device wafer. Once exposed, the photoresist on the device wafer is developed by rinsing in a solution that dissolves selected portions of the photoresist to create a pattern in the photoresist matching the pattern of the mask. Following photolithography is etching. The pattern in the photoresist is typically etched into the underlying film material on the device wafer using gas plasma, resulting in a transfer of the pattern in the photoresist to the film material. These steps of deposition, photolithography, and etching are done repeatedly in the semiconductor fabrication process until the integrated circuit device is completed.

The currently used mask for photolithography is fabricated by a sequence similar to the deposition, photolithography and etching sequence described above. As depicted in FIG. 1a, there is typically provided a transmissive quartz substrate 100. A light-absorbing layer, typically chromium 105, is deposited onto the substrate 100. Photoresist 110 is deposited onto the chromium 105, and an electron beam which is controlled by a computer (not shown) writes a preselected layout pattern onto the photoresist, leaving openings 120 in the photoresist where the electron beam was applied to create a patterned photoresist. The chromium is etched using wet etchants to open selected areas in the chromium to create a patterned chromium 125 as shown in FIG. 1b. The photoresist 110 is then removed and the mask is complete.

The completed mask 130 is placed within a stepper so that light 135 at a preselected wavelength can be shone onto the mask so that the patterned chromium 125 absorptive portions absorb and block the light from passing through and the transmissive portions 145 allow the light to pass through onto a photoresist-covered device wafer 150 below.

As can be seen in FIG. 1b, the patterned chromium 125 following wet etch contains non-vertical sidewalls 155. Having non-vertical sidewalls generally is not a problem for attaining accurate patterning for typically used photolithography wavelengths down to about 248 nm to pattern 0.35 micron feature sizes. It is desirable, however, to have vertical sidewalls to ensure flexibility of the mask for enabling accurate patterning of even smaller feature sizes.

The mask making process also includes removal or repair of defects. Defects need to be removed or repaired because their presence causes undesired pattern transfer from the mask to the wafer. This is done typically using laser ablation or focused ion beam ("FIB"). Defect removal creates its own set of problems in that, if laser ablation is used the underlying substrate can fairly easily be damaged, and while FIB does not pose the same degree of risk of damage to the substrate, the gallium source used for ions creates a "staining", or doping effect in the substrate. Damage or staining in the substrate causes defective light transmission of the desired mask pattern, resulting in poor quality photolithography and possibly defective device wafer patterns, necessitating fabrication of a new mask.

Once the mask fabrication is complete, the mask is protected by a protective cover known as a "pellicle" 170. Without a pellicle, a new mask would almost immediately be rendered unusable. Photolithography is done in an ambient environment where particles are present, even in the cleanest of ambient environments. Cleaning off the particles from the mask can be very difficult because the tight spacing between absorbing layer structures tends to catch particles. In addition, the mask surface is so fragile that even the gentlest handling to clean off particles can create damage to the mask. The pellicle 170 essentially enables a mask to be used in production by accommodating the particles by shielding the mask from particles falling downward perpendicular to the mask. The pellicle 170 is typically made of an organic membrane that is stretched across a metal or plastic frame and is held horizontally parallel to the mask a distance away from the mask surface.

Device line dimensions are shrinking. Presently research is being carried out to enable fabrication of 0.25 microns dimension. It is anticipated that there will be further shrinkage to 0.18 microns and so on in the near future. Photolithography must be carried out at shorter and shorter wavelengths to pattern successfully in shrinking dimensions. Patterning using 248 nm wavelength for 0.25 microns, and 193 nm and 13 nm as wavelengths for smaller sizes are all being currently explored.

To accommodate the shorter wavelengths, novel mask designs, materials and fabrication methods are being explored. For example, as shown in FIG. 2, for 193 nm wavelength the current mask design is a quartz substrate 132 with chromium absorbing layer portions 127. The chromium absorbing layer portions 127 are created via plasma etching of the chromium instead of using wet etchants as in the case of the 248 nm mask. The reason for conversion to plasma etching from wet etching is that plasma etching can be done anisotropically to create vertical sidewalls in the absorbing layer. Vertical sidewalls in the absorbing layer are a necessity for 193 nm wavelength and below because of the greater need for accurate light transmission. However, plasma etching techniques for attaining clean vertical sidewalls in a metal film (such as chromium absorbing layer) are difficult to implement; usually the etched sidewalls contain residues 175 that render the sidewall unsmooth. Another limitation to plasma etching is that typically it is difficult to achieve a clean etch of the entire thickness of the metal film with sufficient selectivity to the underlying substrate material surface 180 such that the substrate surface 180 is clean, intact and not damaged by ion bombardment from the plasma.

The pellicle cannot be used for the shorter wavelengths. At 193 nm wavelength and below a reaction occurs between the light and the air trapped between the pellicle and the mask surface, creating ozone which breaks down the organic membrane film. The organic membrane pellicle as presently used is therefore not useful for the 193 nm and below wavelength regime.

It would be advantageous to have a mask structure which contains absorbing layer portions having vertical sidewalls to enable accurate light transmission. It would be advantageous to have a mask structure which can accommodate a degree of damage or staining due to the defect removal process. It would be further advantageous to have a mask which can be used repeatedly without the presence of a pellicle.

SUMMARY OF THE INVENTION

A mask structure for use in photolithography with a preselected wavelength of light is disclosed. There is a first layer of material transmissive to the preselected wavelength. The transmissive material includes at least one trench portion. An absorbing layer which is absorptive to the preselected wavelength of light is held within the trench portion.

A method of fabricating a mask for use in photolithography is also disclosed. A first layer of material that is transmissive to the wavelength of light to be used is provided. A layer of photoresist is deposited onto the first layer, then the photoresist is patterned to create open portions in the photoresist. The first layer is plasma etched through a portion of its depth such that the open portions in the photoresist are replicated therein to create trench portions. The photoresist is removed. An absorbing layer absorptive to the wavelength of light to be used is deposited into at least the trench portions in the first layer. Then, the surface of the mask having the first layer and absorbing layer is planarized.

DETAILED DESCRIPTION OF THE PRESENT INVENTION

The present invention describes a novel mask structure and method of fabrication to enable photolithography in the future shorter wavelength regimes as well as to improve photolithography at the present wavelengths. In the following paragraphs numerous specific details are set forth such as specific materials, processes, and equipment in order to provide a thorough understanding of the present invention. It will be obvious however, to one skilled in the art, that the present invention may be practiced without these specific details. In other instances, well-known manufacturing materials, processes and equipment have not been set forth in detail in order to not unnecessarily obscure the present invention.

The present invention will be described first in terms of a mask structure having a pattern of transmissive material portions that are transparent to the wavelength of incident light and absorbing material portions that are opaque to and absorb the wavelength of incident light. Then, a method of fabrication of the mask structure will be described which utilizes a "Damascene" approach of depositing a transmissive material, etching a trench, depositing absorbing layer and planarizing the top surface to create the mask structure described. The method of fabrication will be described using two examples, one of a transmissive mask, the other of a reflective mask. Then, a capping layer for protecting the mask structure will be described. Finally, an alternative method of fabrication utilizing a sacrificial layer in lieu of depositing the transmissive material will be described.

Mask Structure

Figure 1A:
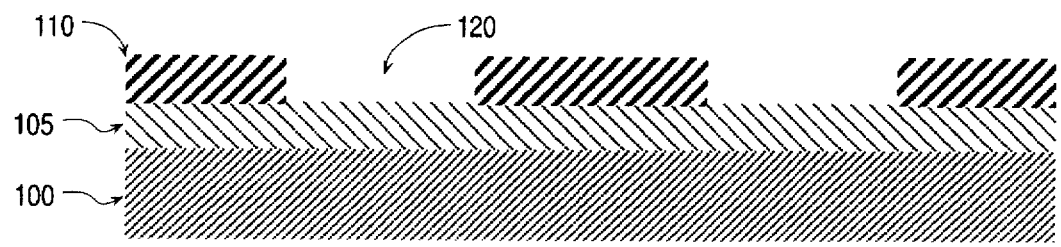
FIG. 1 is an illustration of a cross sectional view of the presently used mask.
Figure 1B:
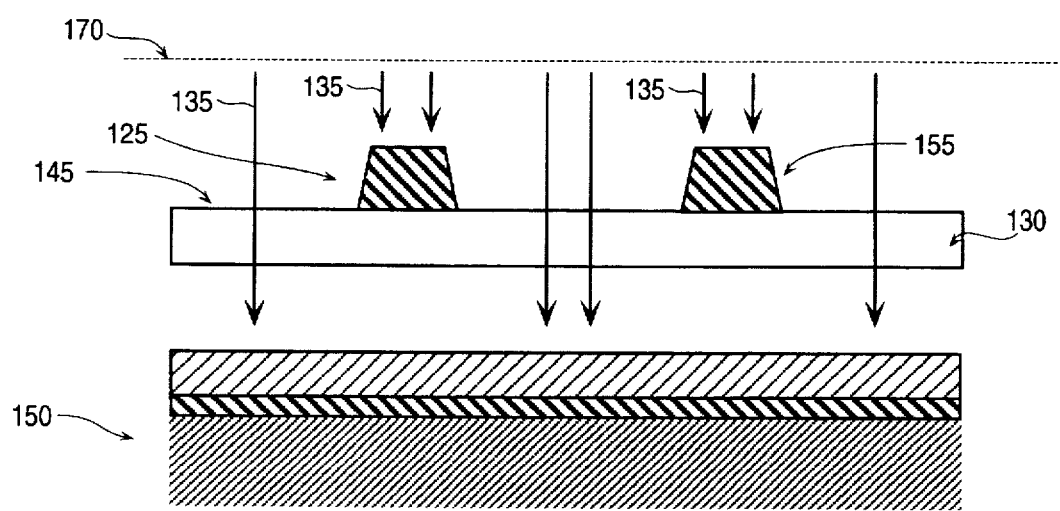
Figure 2:
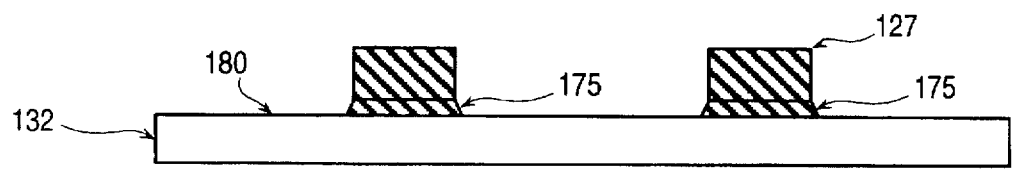
FIG. 2 is an illustration of a cross sectional view of a mask with plasma-etched absorbing portions.
Figure 3:
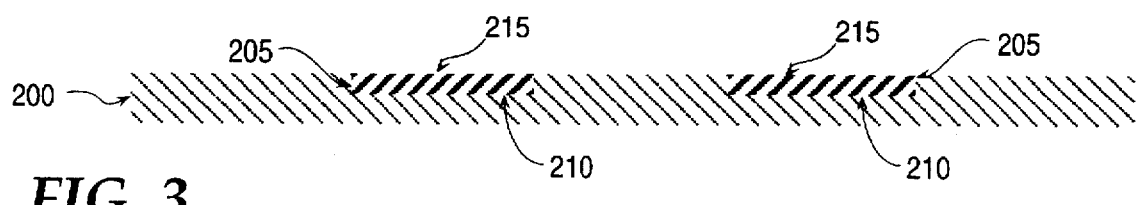
FIG. 3 is an illustration of a cross sectional view of an idealized depiction of a cross section of a completed mask of the present invention.

An idealized depiction of the mask of the present invention is shown in FIG. 3. As can be seen, the mask structure is a transmissive layer portion 200 having portions of absorbing material 215 held therein. One aspect of how this differs from the presently used, or traditional mask structure is that the absorbing material portions are held within trench portions as opposed to absorbing material portions being disposed above the plane of the transmissive layer. The transmissive material 200 is selected to be one that is capable of being cleanly etched in gas plasma so as to provide smooth etched substantially vertical sidewalls 205 in trench portions 210. The transmissive material is also transparent to the wavelength of light being used in the photolithography process. In the case of wavelengths of approximately 248 nm to 157 nm, the transmissive material 200 is preferably calcium fluoride, magnesium fluoride or indium tin oxide or other material transparent to the selected wavelength. In the case of shorter wavelengths such as 13 nm, the transmissive material 200 is silicon or other material transparent to the selected wavelength. The transmissive material or layer 200 should be sufficiently thick that it can support an absorbing material 215 held within the trench portions 210 of the transmissive layer 200, and sufficiently thin that it substantially allows the incident light to pass through the transmissive layer 200. The absorbing layer 215 is a material that absorbs all of the incident light and is opaque to the wavelength of light being used. In the case of approximately 248 nm to 193 nm, the absorbing layer is chromium. In the case of shorter wavelengths such as 13 nm, the absorbing layer is titanium or aluminum or other material that is opaque to the selected wavelength. How the structure of the mask is fabricated will be described next using the examples of a transmissive mask, followed by a reflective mask.

Transmissive Mask Fabrication Process

Figure 4A:
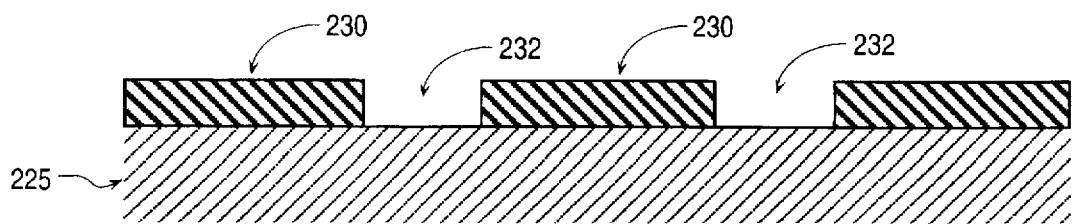
FIG. 4 is an illustration of a cross sectional view of a fabrication process for the mask of the invention.
Figure 4B:
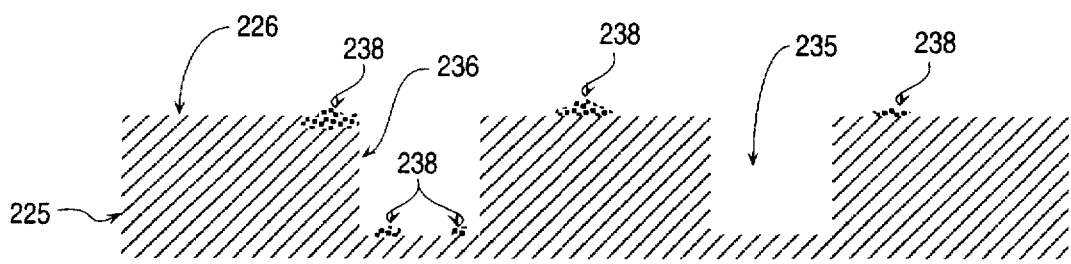

For a transmissive mask, the starting point can be a transmissive material layer 225 as shown in FIG. 4a. The transmissive material is any material that can be plasma etched and is transparent to the incident light. Note that, the transmissive material layer 225 is preferably deposited over a substrate (not shown) made of a material that is transparent to the selected wavelength. As shown in FIG. 4a, photoresist 230 is spun onto the transmissive material. The photoresist is of a thickness which is sufficiently thin to provide accurate patterning of a silicon wafer (not shown) but thick enough to withstand a subsequent plasma etch. A preselected layout pattern is written into the photoresist 230 using an electron beam or other similar method capable of creating fine features. The photoresist 230 is then developed to open patterns 232 in the photoresist 230 exposing portions of the transmissive material layer 225. As shown in FIG. 4b, the pattern in the photoresist 230 is transferred or replicated into the transmissive layer 225 by plasma etching using a commercially available plasma etcher using a known plasma etching process that etches into a film to create substantially vertical sidewalls in the etched film. The plasma etch is stopped before the transmissive material 225 is completely etched so as to form trenched or cutout portions 235. The photoresist 230 is then removed. The advantage of having the transmissive layer as the layer to be etched, in contrast with the absorbing layer as the layer to be etched is that the etch process for the transmissive layer is more robust and will tend to etch cleanly with vertical sidewalls. A further advantage is that any defects created during the etching process can be eliminated during the defect removal step (to be described below).

Figure 4C:
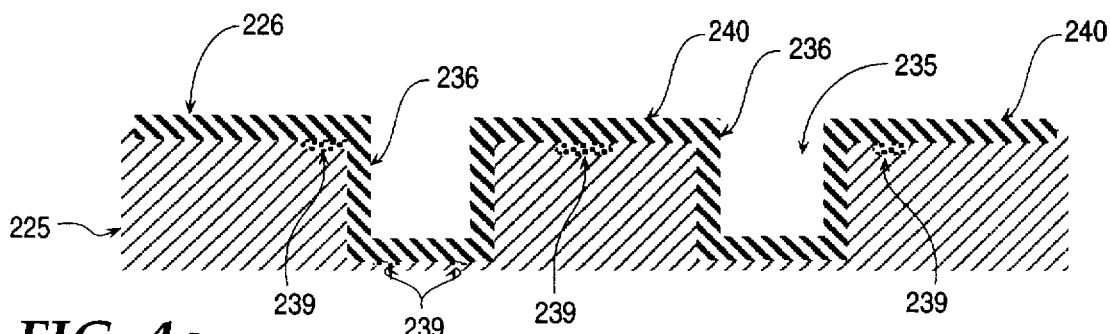

Following creation of the trench 235 in the transmissive material the mask is placed in an inspection tool such as the KLA 351 to inspect for defects 238 if any, arising from the etching step. If defects 238 are found, the defects are removed or repaired via the well-known methods of laser ablation or FIB (using Micrion 8000, for example) or another method similarly capable. The advantage of removing or repairing defects in the transmissive material is that, as shown in FIG. 4c, even if there remains some damage or staining 239 from the defect removal process, such damage or staining 239 will be covered over by the absorbing layer 240 within the trenches 235. The presence of such damage or staining therefore will not matter for purposes of the photolithography process because the light will be absorbed by the absorbing layer covering such damage or staining. If damage or staining 239 occurs in other areas, they will be removed in a subsequent planarization step.

Next, the absorbing layer 240 is deposited over the transmissive material 225. The absorbing layer 240 is any material that is opaque to and will tend to absorb the applied incident light wavelength. In the case of 193 nm wavelengths, the absorbing layer 240 is preferably chromium. The deposition process is a known process for depositing thin films of absorbing material (on the order of, for example, approximately 500 to 2000 Angstroms) such as chemical vapor deposition, sputter deposition or evaporation, so as to partially or completely fill the trench portions 235. The absorbing layer 240 will tend to deposit not only within the trenched portions 235 but also on the sidewalls of the trench portions 236 as well as on the top surface portions 226 of the transmissive material 225.

Figure 4D:
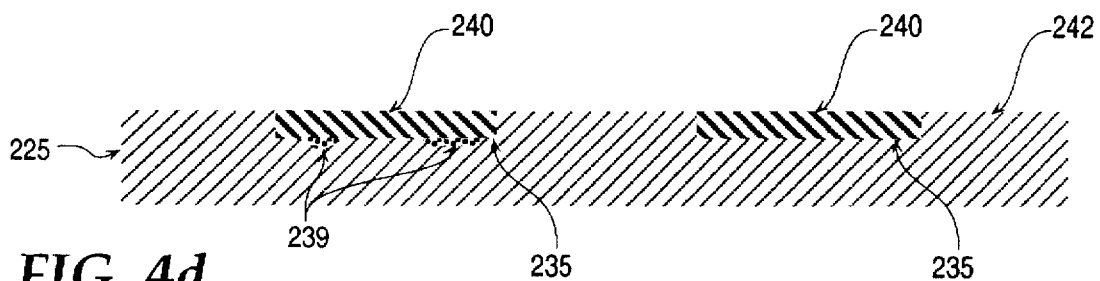

Following deposition of the absorbing layer 240 the mask is ready for planarization. Although planarization can be done in several known ways to provide a smooth, flat surface, the preferred method is to use chemical mechanical polishing. Chemical mechanical polish is the favored method of planarization because it is simple, inexpensive and enables a uniform planar finish. A commercially available polishing system using well-known polishing conditions and slurries is used. With chemical mechanical polishing, the entire mask surface including absorbing layer portions 240 deposited on sidewalls 236 of the trenched portions 235 is ground down to create an overall flat, smooth surface to the mask 242 as shown in FIG. 4d. The polishing process removes any staining or damage 239 following defect removal from exposed portions of the transmissive material 225 prior to deposition of the absorbing layer 240. If desired, this portion of the process can be carried out iteratively by partially polishing, inspecting for defects, removal of defects, adjusting the polishing to remove defect-causing effects, and so on. The end result is a completed mask as shown in FIG. 4d with a substantially smooth mask surface 242 and absorbing layer portions 240 that are clean with vertical sidewalls. When this step is complete, the mask is complete and ready for use.

Note how this basic fabrication technique removes the need for etching of the absorbing layer altogether. Moreover, the top surface of the completed mask structure is smooth and flat, as opposed to the traditional mask where the absorbing layer portions are disposed above the plane of the transmissive material. An advantage of having a smooth and flat mask structure over a topographical structure is that it is easier to detect particles and clean the surface of particles. In addition, because the absorbing layer is not raised up over the plane of the transmissive material layer the absorbing layer pattern is less prone to damage during handling.

Reflective Mask Fabrication Process

Figure 5A:
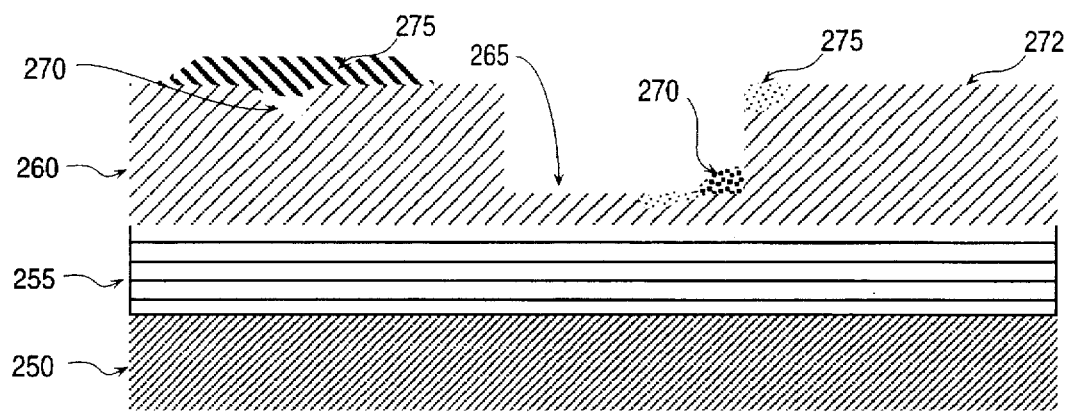
FIG. 5 is an illustration of a cross sectional view further describing the fabrication process, in the example of where the mask is reflective.
Figure 5B:
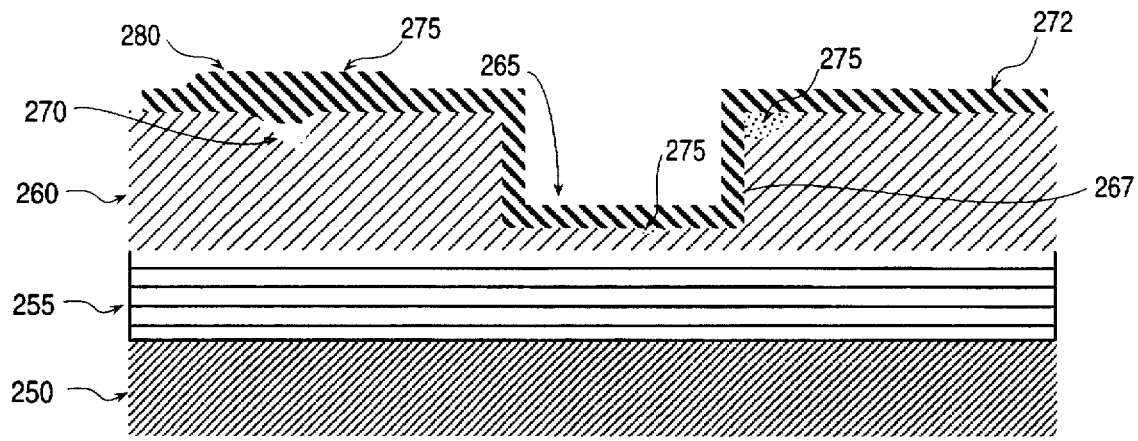
Figure 5C:
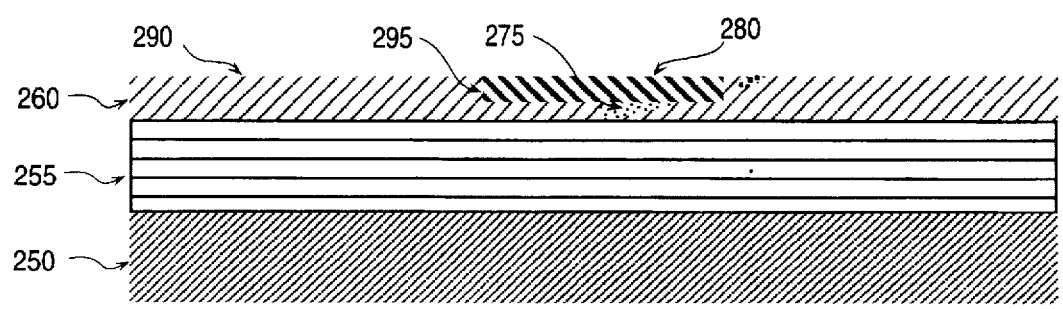

In the case of a reflective mask, incident light reflects off portions of the mask forming a pattern that is transferred onto a photoresist-covered wafer or substrate via a series of mirror-coated lenses. Non-reflecting portions of the mask surface are typically absorptive, although transmissive portions can be used. The fabrication process in the case of a reflective mask is shown in FIGS. 5a–5c. As shown in FIG. 5a, a mask substrate 250 prepared with a reflective surface 255 is used, and the mask structure is built thereon. The reflective surface is usually a single layer metal such as aluminum that provides a reflective surface for incident light wavelengths down to about 120 nm. At still smaller wavelengths, the needed reflectance is typically obtained using a more complex reflective surface structure known as a resonant reflector. The resonant reflector is the embodiment shown for the reflective surface 255. A resonant reflector is described in the example for a mask for 13 nm wavelength photolithography described below.

The preferred embodiment for the underlying substrate 250 is silicon. Other materials, such as quartz, or any other material (whether transparent or opaque to the applied wavelength) on which the mask can be fabricated, can be used. The advantage of using silicon as the underlying substrate material is that a silicon wafer can be conveniently used.

For use in the 13 nm wavelength regime, it is preferred that the substrate 250 is first prepared by applying sheets of thin films of alternating reflective and transmissive materials to create a resonant reflecting mirror surface 255. The number of sheets, the reflective material and relative thicknesses are determined based on a number of factors including the wavelength of light and reflectivity of the material and resonance of the light waves to attain the maximum accurate reflection. In the example provided here, 80 sheets of alternating 28 angstrom molybdenum and 40 angstrom silicon are used; the topmost sheet of the reflective surface is silicon to provide protection to the topmost sheet of resonant reflecting mirror surface.

Over the topmost sheet of the reflective surface 255 a fairly thick layer of transmissive material 260, for example, 1000–1500 angstroms, is deposited. The thickness of this transmissive layer 260 should be less than the depth of focus for the defect inspection tool being used (to be described further below). The transmissive material is selected to be that which is transmissive to the wavelength of light being used. In the embodiment for 13 nm wavelength regime, silicon is used in transmissive layer 260 because of its transparency to 13 nm wavelength. The transmissive material layer 260 can be single crystal silicon, polycrystalline silicon or amorphous silicon. The transmissive material 260 is deposited using chemical vapor deposition or another known technique that enables deposition of the desired film without causing the underlying reflective and transmissive material sheets to flow or diffuse or otherwise lose their effectiveness. Patterning of the transmissive material 260 is done using a technique similar to that described above, starting with patterned photoresist (not shown). The substrate 250 having the transmissive layer 260 is then placed in a commercially available plasma etcher, and the silicon transmissive layer 260 is etched partway down to create trench cutout portions 265. The etch depth is chosen to be a distance above the surface of the substrate 250 and reflective portion 255 so that the subsequently deposited absorbing layer and any defects at the bottom of the trench 265, should they occur, will not impinge on the substrate 250 and reflective portion 255. An alternative is to apply a very thin transmissive material coating and plasma etch all the way through the transmissive material as well as through the reflective portion to create a trench cutout portion in the substrate itself The advantage of having the silicon transmissive layer as the layer to be etched, in contrast with the absorbing layer as the layer to be etched is that the etch process for silicon is robust and more reliable than an etch process used for an absorbing layer and will tend to etch cleanly with vertical sidewalls. A further advantage is that any defects created during the etching process can be eliminated during the defect removal step (to be described below). Moreover, in the case of the conventional process of plasma etching the absorbing material, it is nearly impossible to completely and cleanly etch all of the way through a metallic absorbing layer without etching into the reflective portion because the same gases used to etch the metallic absorbing layer also etch silicon. Etching trenches into the transmissive layer avoids the problem associated with plasma etching the metallic absorbing layer.

Following creation of the trench cutout portions 265 the remaining photoresist is removed using a known process of plasma etching or wet etching (not shown). Then, the mask is placed in an inspection tool such as the KLA 351 to inspect for defects 270 if any, arising from the etching step. If defects 270 are found, the defects are removed or repaired via the well-known methods of laser ablation or FIB (using Micrion 8000, for example) or another method similarly capable. The advantage of removing or repairing defects in the transmissive material is that, even if there remains some damage or staining 275 from the defect removal or repair process, such damage or staining 275 will be covered over by the absorbing layer 280 within the trenches 265 as shown in FIG. 5b. The presence of such damage or staining in the trench areas will not matter because the applied light will be absorbed by the absorbing layer 280 covering such damage or staining 275 in the trenches 265. If defects 270 or staining 275 occur in other areas, they will be removed in a subsequent planarization step. Note that this advantage of being able to remove defects is not present in the conventional process for making masks, which does not involve planarization.

As shown in FIG. 5b, following inspection and removal of defects in the transmissive material 260, a film of absorbing layer 280 is deposited. In the example of 13 nm wavelength the absorbing layer is preferably titanium or aluminum or other material having the characteristic of being opaque to the applied light wavelength. The deposition technique is a known chemical vapor deposition, sputter or evaporation or other technique that provides for deposition without causing the underlying reflective and transmissive sheets to flow or diffuse or otherwise lose their effectiveness. The deposited absorbing layer 280 fills or partially fills the trench cutouts 265 and deposits on the sidewalls 267 of the trench cutouts and deposits on the top surface portions 272 of the transmissive material layer 260. Note that the deposition may not entirely fill the volume of the trench portions 265. The absorbing material 280 in the trench 265 will be subsequently thinned during a following planarization step, so that the final thickness of the absorbing layer is determined subsequent to planarization. The post-polish thickness of the absorbing layer 280 is in the example of 13 nm wavelength approximately 500 angstroms in the case of titanium, and is approximately 800 angstroms in the case of aluminum.

Following deposition of the absorbing layer 280 the mask is ready for planarization. Although planarization can be done in several known ways to provide a smooth, flat surface, the preferred method is to use chemical mechanical polishing. Chemical mechanical polish is the favored method of planarization because it is simple, inexpensive and enables a uniform planar finish. A commercially available polishing system using well-known polishing conditions and slurries is used. With chemical mechanical polishing, the entire mask surface including absorbing layer portions deposited on sidewalls of the trenched portions 267 is ground down to create an overall flat, smooth surface to the mask having absorbing layer portions embedded in the transmissive layer as shown in FIG. 5c. The polishing process removes any staining or damage 275 following defect removal from the top surface portions 272 of the transmissive material 260. If desired, this portion of the process can be carried out iteratively by partially polishing, inspecting for defects, removal of defects, adjusting the polishing to remove defect-causing effects, and so on. The end result is a completed mask as shown in FIG. 5c with a substantially smooth mask surface 290 and absorbing layer portions 280 that are clean with vertical sidewalls 295. When this step is complete, the mask is complete and ready for use.

Capping Option

Figure 6:
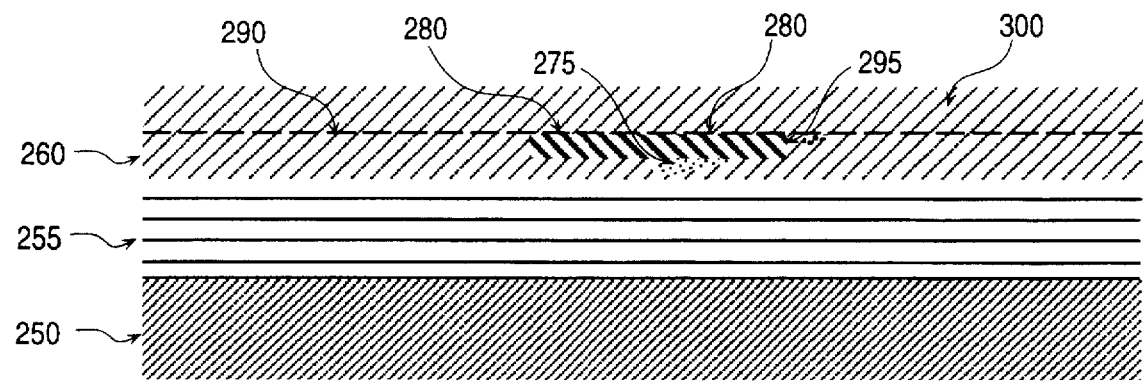
FIG. 6 is an illustration of a cross sectional view of the mask first depicted in FIG. 3, wherein the mask is capped.

An option in the case of either transmissive mask or reflective mask, fabricated using the process disclosed herein or, for that matter, using a conventional or other process, is to do an additional processing step of capping the surface of the polished mask with a second layer of transmissive capping material 300 as illustrated in FIG. 6. Using the example of the above-described reflective mask, the transmissive capping material 300 is preferably the same material as the transmissive layer 260. The capping material 300 is deposited onto the top surface 290 of the transmissive layer 260 using chemical vapor deposition or other known technique that will not subject the underlying absorbing layers or reflective layers to flowing or diffusion or other loss of effectiveness. If needed, the top surface of the capping material 300 following deposition can be smoothed out by chemical mechanical polishing or other known planarization method to form a smooth and flat final mask top surface. The capping material 300 thickness should be the maximum thickness possible to enable a substantially defect-free film and adequately protect the mask structure while providing for clean accurate transmission of incident light.

Figure 7:
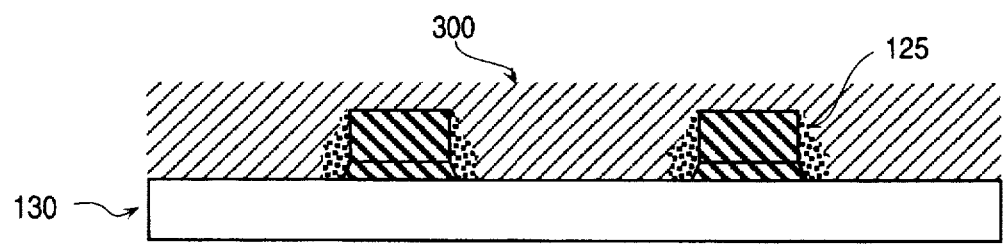
FIG. 7 is an illustration of a cross sectional view of a traditional mask having a capping layer.

It should be noted that, as shown in FIG. 7, the capping layer can be added onto any mask if desired, including the traditional mask with wet-etched absorbing portions 125 standing above the plane of the transmissive surface 130. The transmissive capping material layer 300 in the case of FIG. 7 is deposited onto the mask such that it fills all the spaces between the absorbing layer portions 125 and completely covers the top of the absorbing layer portions 125. If needed, the capping material layer 300 can be planarized using chemical mechanical polishing or other known planarization method to form a smooth and flat final mask top surface.

The resulting mask following application of the capping material layer has a protective coating, a kind of pellicle, for the absorbing layers which can tend to be more fragile than silicon. The protective coating also can provide a smooth finish to an otherwise topographic mask surface to improve the photolithography. Having a smooth and planar capping layer to protect the mask provides more flexibility in the photolithography process and allows effective in situ surface defect inspection. The stepper can be set up with an inspection module within the tool to enable easy inspection within the stepper and therefore improve throughput.

Sacrificial Layer Option

Figure 8A:
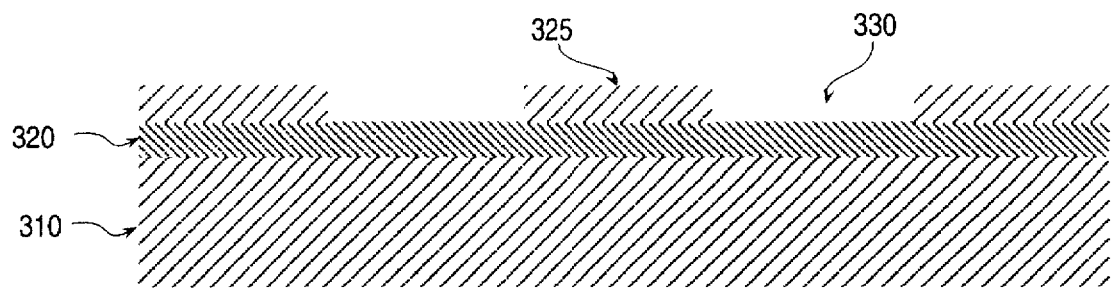
FIG. 8 is an illustration of a cross sectional view of an alternative fabrication process and mask embodiment.
Figure 8B:
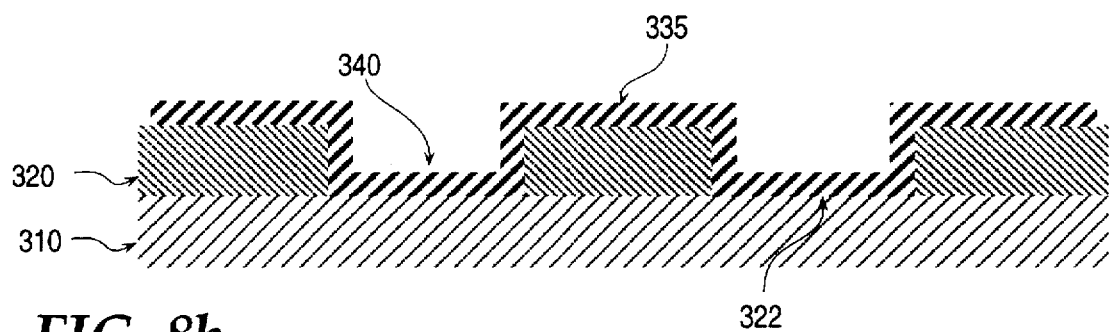
Figure 8C:

An alternative embodiment to the mask fabrication process described above is to use a sacrificial material layer instead of the transmissive material layer as shown in FIG. 8a–8d. As shown in FIG. 8a, a substrate 310 with a layer of sacrificial material 320 deposited thereon is provided. The sacrificial material layer 320 is chosen to provide a combination of a selective plasma etch relative to the underlying material and vertical etch having smooth sidewalls. Photoresist 325 is deposited onto the sacrificial layer 320 and a pattern is written into the photoresist in accordance with a preselected layout pattern and the photoresist is developed to create openings 330 in the photoresist. The sacrificial material 320 layer is selectively plasma etched through the entire depth of the layer to leave etched portions 322 as shown in FIG. 8b. The selectiveness of the etch prevents the etch from going into the substrate layer. The remaining photoresist is removed. Then, an absorbing layer 335 is deposited as shown in FIG. 8b into the etched portions of the sacrificial layer 322, into the bottom as well as on the sidewalls. The mask surface is then planarized as shown in FIG. 8c to create an overall smooth, flat mask surface 330. The sacrificial layer 320 is then removed, typically by rinsing in an etching solution which etches the sacrificial layer selectively relative to the absorbing layer portions and the underlying surface.

Figure 8D:
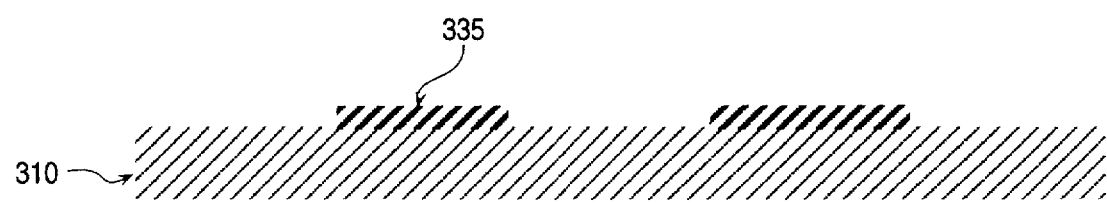

The remaining structure is as shown in FIG. 8d, that of a substrate with mask portions similar to the currently used mask, except with smooth, vertical sidewalls in the absorbing layer. And if desired, a capping material can be placed over the mask in a manner similar to that described above.

As an example of how the mask of the invention can be used in a photolithography process, a substrate, usually a silicon wafer, containing a material of film to be patterned and covered with patterned photoresist is placed within a stepper onto a holder. A mask having a planarized substantially smooth surface is provided. Note that the planarized substantially smooth surface can be obtained by the fabrication processes described above for the transmissive mask or reflective mask including or not including a capping layer. The planarized substantially smooth surface can also be attained on a topographic mask surface by placing a capping material layer thereon as described above. Then, light at a previously selected wavelength is applied to the mask so that the pattern of the mask is replicated onto the photoresist covering the substrate. Finally, the substrate is removed from the stepper.

Thus, a novel mask for photolithography and fabrication method is disclosed. While the present invention has been described with reference to specific embodiments thereof, many variations of the present invention will be obvious to one skilled in the art and are considered to be within the scope and spirit of the present invention.

I claim:

1. A mask structure for use in photolithography with a preselected wavelength of light, said mask comprising:

a mask substrate containing a surface that is substantially reflective to said preselected wavelength;

a first layer of material on said mask surface that is substantially transmissive to said preselected wavelength;

a trench portion in said first layer;

an absorbing layer portion held within the trench portion, the absorbing layer being absorptive to the preselected wavelength of light; and wherein the top surface of the mask structure is substantially smooth and planar.

2. The mask structure of claim 1, wherein said first layer is comprised of silicon.

3. The mask structure of claim 1, wherein said first layer is selected from the group consisting of calcium fluoride, magnesium fluoride and indium tin oxide.

4. The mask structure of claim 1, wherein said absorbing layer is selected from the group consisting of chromium, aluminum and titanium.

5. The mask structure of claim 1, wherein said mask substrate further comprises a transmissive material underneath said reflective surface.

6. The mask structure of claim 5, wherein said substrate is made of silicon.

7. The mask structure of claim 5, wherein said substrate is made of quartz.

8. The mask structure of claim 1, further comprising a second layer of material transmissive to said preselected wavelength deposited over the top surface of the mask to provide a protective cap.

9. A method of fabricating a mask having a substantially smooth planar top surface, for use in photolithography, comprising:

providing a substrate containing a mask surface;

depositing a first layer of material on the mask surface that is transmissive to the wavelength of light to be used;

depositing a layer of photoresist above said first layer;

patterning said photoresist to create open portions in the photoresist;

plasma etching said first layer through a portion of the depth of said first layer such that the open portions in the photoresist are replicated therein to create trench portions in said first layer;

removing said photoresist;

depositing an absorbing layer absorptive to the wavelength of light to be used into at least said trench portions in said first layer; and planarizing the surface of said mask having said first layer and said absorbing layer deposited thereon.

10. The method of fabricating a mask as in claim 9, further comprising depositing over planarized top surface of said first layer a second layer of material transmissive to the wavelength of light to be used to form a protective cap.

11. The method of fabricating a mask as in claim 10, further comprising planarizing said second layer of material.

12. The method of fabricating a mask as in claim 10, wherein said second layer and first layer are comprised of the same material.

13. The method of fabricating a mask as in claim 9, wherein said substrate comprises a silicon wafer.

14. The method of fabricating a mask as in claim 9, wherein said step of planarizing the surface of said mask includes chemical mechanical polishing.

15. A method of fabricating a mask having a substantially smooth planar top surface, for use in photolithography, comprising:

providing a substrate;

depositing a first layer of material onto the substrate that is transmissive to the wavelength of light to be used;

depositing a layer of photoresist above said first layer;

patterning said photoresist to create open portions in the photoresist;

plasma etching said first layer through a portion of the depth of said first layer such that the open portions in the photoresist are replicated therein to create trench portions in said first layer;

removing said photoresist;

removing defects from said first layer;

depositing an absorbing layer absorptive to the wavelength of light to be used into at least said trench portions in said first layer; and planarizing the surface of said mask having said first layer and said absorbing layer deposited thereon.

16. The method of fabricating a mask as in claim 15, further comprising depositing over planarized top surface of mask layer a second layer of material transmissive to the wavelength of light to be used.

17. The method of fabricating a mask as in claim 16, further comprising planarizing said second layer of material.

18. The method of fabricating a mask as in claim 16, wherein said second layer and first layer are comprised of the same material.

19. The method of fabricating a mask as in claim 15, wherein said substrate comprises a silicon wafer.

20. The method of fabricating a mask as in claim 15, wherein said substrate includes a reflecting mirror portion reflective to the wavelength of light being used.

21. A method of processing semiconductor integrated devices, comprising the steps of:

providing a substrate having a material to be patterned;

applying photoresist to the substrate so as to cover the material to be patterned;

placing the photoresist-covered substrate onto a holder within a photolithography tool capable of operation at a preselected wavelength of light;

providing a reflective mask having a planarized substantially smooth top surface;

applying said preselective wavelength of light to the mask such that the pattern of the mask is replicated onto the photoresist on the substrate; and removing the substrate from the photolithography tool.

22. The method of processing semiconductor integrated devices as in claim 21, wherein said mask further includes a first layer of material transmissive to said preselected wavelength, a trench portion in said first layer and an absorbing layer portion held in the trench portion, the absorbing layer being absorptive to the preselected wavelength of light.

23. A reflective mask structure for use in photolithography at a preselected wavelength, comprising:

a layer of transmissive material deposited over the mask structure so as to create a cap over said mask structure, said cap having a substantially smooth planar top surface.

24. A method of fabricating a mask for use in photolithography, comprising:

providing a substrate;

depositing onto the substrate a sacrificial layer;

depositing a layer of photoresist above said sacrificial layer;

patterning said photoresist to create open portions in the photoresist;

plasma etching through the entire depth of said sacrificial layer using a process that is selective to the substrate so that the open portions in the photoresist are replicated in the sacrificial layer so as to create a top surface portion and etched portion in the sacrificial layer;

removing said photoresist;

depositing an absorbing layer absorptive to the wavelength of light to be used at least into the open portions of said sacrificial layer;

planarizing the mask to create a substantially flat smooth top surface; and removing said sacrificial layer.

25. The method of fabricating a mask as in claim 24, wherein said step of planarizing is carried out by chemical mechanical polishing.

26. The method of fabricating a mask as in claim 24, wherein said substrate is comprised of a material that is transmissive to the wavelength of light to be used.

27. The method of fabricating a mask as in claim 24, wherein said substrate is comprised at least in part of a material that is reflective to the wavelength of light to be used.

28. The method of fabricating a mask as in claim 24, wherein said absorbing material is comprised of chromium.

29. The method of fabricating a mask as in claim 24, wherein said absorbing material is comprised of titanium.

30. The method of fabricating a mask as in claim 24, wherein said absorbing material is comprised of aluminum.

* * * * *

UNITED STATES PATENT AND TRADEMARK OFFICE
CERTIFICATE OF CORRECTION

PATENT NO. : 5,795,684
DATED : August 18, 1998
INVENTOR(S) : Patrick M. Troccolo It is certified that error appears in the above-identified patent and that said Letters Patent is hereby corrected as shown below:

In column 12 at line 7 insert --, over which a first layer of transmissive material is deposited, said mask-- following "reflective mask" and prior to "having"

Signed and Sealed this

Eighteenth Day of May, 1999

Attest:

Q. TODD DICKINSON

*Attesting Officer*     Acting Commissioner of Patents and Trademarks